United States Patent [19]
Hunter et al.

[11] Patent Number: 5,940,725
[45] Date of Patent: *Aug. 17, 1999

[54] SEMICONDUCTOR DEVICE WITH NON-DEPOSITED BARRIER LAYER

[75] Inventors: Thomas Hunter, Cornwall-on-Hudson; Joseph M. Morton, New Windsor, both of N.Y.; Susan Eileen Shore, Burlington, Vt.; Anthony J. Yu, Poughquag, N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/911,584

[22] Filed: Aug. 14, 1997

Related U.S. Application Data

[63] Continuation of application No. 08/239,642, May 9, 1994, abandoned.

[51] Int. Cl.⁶ ............................................. H01L 21/3205
[52] U.S. Cl. ........................ 438/592; 438/229; 438/653; 438/528
[58] Field of Search ..................................... 257/369, 640, 257/412, 413; 438/287, 592, 593, 594, 652, 653, 655, 231, 232, 528, 229

[56] References Cited

U.S. PATENT DOCUMENTS

| | | | |
|---|---|---|---|
| 4,016,007 | 4/1977 | Wada et al. | 438/297 |
| 4,180,596 | 12/1979 | Crowder et al. | 427/42 |
| 4,470,189 | 9/1984 | Roberts et al. | 29/571 |
| 4,558,338 | 12/1985 | Sakata | 357/23.9 |
| 4,584,760 | 4/1986 | Okazawa | 29/571 |
| 4,609,903 | 9/1986 | Toyokura et al. | 252/512 |
| 4,640,004 | 2/1987 | Thomas et al. | 29/590 |
| 4,656,729 | 4/1987 | Kroll et al. | 438/287 |
| 4,682,407 | 7/1987 | Wilson et al. | 438/517 |
| 4,688,078 | 8/1987 | Hseih | 257/321 |
| 4,789,560 | 12/1988 | Yen | 438/386 |
| 4,897,368 | 1/1990 | Kobushi et al. | 437/200 |
| 4,900,590 | 2/1990 | Tamura | 437/43 |
| 5,023,679 | 6/1991 | Shibata | 357/23.4 |
| 5,041,361 | 8/1991 | Tsuo | 438/911 |
| 5,103,285 | 4/1992 | Furumura et al. | 357/68 |
| 5,147,820 | 9/1992 | Chittipeddi et al. | 437/193 |
| 5,218,232 | 6/1993 | Yuzurihara et al. | 251/412 |
| 5,364,804 | 11/1994 | Ho et al. | 438/592 |
| 5,488,246 | 1/1996 | Hayashide et al. | 257/336 |
| 5,518,960 | 5/1996 | Tsuchimoto | 438/487 |
| 5,668,028 | 9/1997 | Bryant | 438/287 |

FOREIGN PATENT DOCUMENTS

| | | |
|---|---|---|
| A-0 168 125 | 1/1986 | European Pat. Off. . |
| A-0 463 332 | 1/1992 | European Pat. Off. . |
| A-61 030 076 | 2/1986 | Japan . |
| A-01 238 126 | 9/1989 | Japan . |
| A05 166 802 | 7/1993 | Japan . |

OTHER PUBLICATIONS

H.H. Chao, et al., IBM Technical Disclosure Bulletin, vol. 27, No. 11, Apr. 1985, pp. 6652–6655.

Applied Physics Letters, vol. 59, No. 21, Nov. 18, 1991, New York U.S. pp. 2742–2744.

D. Bolmont Et Al. "Room–temperature $Si_3N_4$ and $Ge_3N_4$ growths by Si and Ge surface irradiation with $N_2$ electron cyclotron resonance plasma" *abstract; figure 3; table 1*.

Journal of Vacuum Science and Technology; Part A, vol. 5, No. 4, Aug. 1987, New York, U.S. pp. 1793–1794, M. Kitabatake ET K. Wasa "Hydrogen–free SiN films prepared by ion–beam sputter deposition".

*Primary Examiner*—Michael Trinh
*Attorney, Agent, or Firm*—Alison D. Mortinger

[57] ABSTRACT

A semiconductor device comprises a semiconductor substrate of a first conductivity type, a first conductive layer formed in the semiconductor substrate using a dopant, and being of a second conductivity type, a silicon-rich nitride film formed on the first conductive layer, and a second conductive layer formed on the silicon-rich nitride film, wherein the silicon-rich nitride film inhibits outdiffusion of dopant from the first conductive layer into the second conductive layer, and blocks interdiffusion between the second conductive layer and the first conductive layer.

5 Claims, 5 Drawing Sheets

SEMICONDUCTOR DEVICE WITH NON-DEPOSITED BARRIER LAYER

The application is a continuation of application Ser. No. 08/239,642, filed May 9, 1994, now abandoned.

TECHNICAL FIELD

The present invention relates generally to semiconductor devices and, more particularly, to a semiconductor device with a non-deposited barrier layer formed therein.

BACKGROUND OF THE INVENTION

The use of advanced semiconductor lithography and etching processes has enabled significant reductions in the dimensions of semiconductor devices, and this has resulted in a concomitant increase in semiconductor device operating speed. These reductions in device dimensions lead to a corresponding decrease in the cross-sectional area of the device's interconnect regions. Unfortunately, these reduced interconnect regions adversely affect performance speed by increasing interconnection time delays that result from material and circuit parameters.

A solution to the problem of increased interconnection time delays involves positioning a metal silicide layer on top of a doped polycrystalline silicon in order to lower the sheet resistance of the polycrystalline silicon interconnections, and thus increase circuit speed. See, U.S. Pat. No. 4,180,596, issued Dec. 25, 1979, to Crowder et al. However, while the addition of the metal silicide layer lowers sheet resistance and thereby increases circuit speed, the dopants introduced to the polycrystalline silicon backdiffuse or outdiffuse into the metal silicide during subsequent annealing and oxidation steps. This leads to an increase in resistance of the polycrystalline silicon and creates undesirable device properties. Furthermore, with this solution, it becomes necessary to manufacture a silicide structure such that the metal atoms of a refractory metal or metal silicide are prevented from diffusing through the polysilicon and into the gate oxide during subsequent heat treatments.

As a specific example, referring now to FIG. 1, a conventional dual-gate complementary-metal-oxide-semiconductor (CMOS) device 2 with silicided gates 4,6, which is a conventional dual work-function MOSFET, is shown. The device 2 includes a gate oxide film 8 deposited on a semiconductor substrate 10, and also includes isolations 12 which function to isolate or separate the different regions of the device 2. Silicided gate 4 is situated above N-well 14 and P+ source/drain regions 16; and silicided gate 4 comprises a P+ polysilicon layer 18, a silicide layer 20 and a dielectric or insulating film 22. Silicided gate 6 is situated above P-well 24 and N+ source/drain regions 26; and silicided gate 6 comprises a polysilicon layer 28, a silicide layer 30 and a dielectric or insulating film 32. The silicide layer 30 can be comprised of a refractory metal, such as W, Ti, Ta, or a metal silicide.

A problem which is intrinsic to the conventional dual work-function MOSFET device 2 occurs due to the high temperature annealing typically applied to the polysilicon and metal silicide layers during manufacture. Since the metal silicide material has a high melting point, during such a heat treatment, metal atoms within the metal silicide layer diffuse through the polysilicon, via grain boundary diffusion, and into the gate oxide film 8. Disadvantageously, such diffusion lowers the breakdown voltage of the gate oxide film 8. As device dimensions shrink to ultra-large-scale-integration, the polysilicon layer becomes correspondingly thinner, thus exacerbating this defect.

Further, for submicron technologies, buried channel devices are extremely sensitive to problems caused by higher processing temperatures. Although the dual work-function polysilicon/silicide (polycide) structure, such as the device 2 shown in FIG. 1, offers an attractive structure for CMOS applications, the silicide acts as a diffusion sink for the dopants in the polysilicon. A strong thermodynamic driving source for metal-dopant formation leads to undesirable cross-contamination of dopants, and results in unwanted changes to gate doping levels and transistor threshold voltages.

In order to prevent the problem of metal atoms diffusing into the gate oxide, methods of depositing a diffusion barrier, such as a silicon nitride, titanium nitride, or zirconium nitride film, between the polysilicon and low resistance silicide utilizing chemical vapor deposition (CVD) have been proposed. See, for example, H. H. Chao et al., IBM Technical Disclosure Bulletin, Vol. 27, No. 11, April 1985. It is difficult, however, to deposit an ultrathin silicon nitride film by CVD with reproducibility of film thickness, and especially difficult to perform such deposition at temperatures which are adequately low for preventing changes in the electrical characteristics of the device.

U.S. Pat. No. 4,897,368, issued Jan. 30, 1990, to Kobushi et al., discloses blocking diffusion flux of metal through polysilicon using conventional ion implantation of nitrogen and oxygen to form a buried nitride/oxide layer within the polysilicon. However, such a structure is limited by the thickness of the polysilicon layer and the energy of the ion implantation.

U.S. Pat. No. 4,640,004, issued Feb. 3, 1987, to Thomas et al., discloses placement of a deposited refractory metal nitride between doped silicon and silicide, with an additional deposition of a titanium film interposed between the nitride and the polysilicon to lower contact resistance. However, such a method involves significant complexity and relies on a narrow process window of two sputtered films, wherein the process window has a very specific thickness.

U.S. Pat. No. 5,023,679, issued Jun. 11, 1991, to Shibata, discloses a polysilicon/silicon, oxide/metal silicide gate electrode with a polysilicon sidewall spacer strapping the doped polysilicon gate conductor and the lower resistivity silicide film, wherein the oxide layer functions as a diffusion barrier. However, Shibata adds complexity to the fabrication process since additional processing is required to electrically connect the polysilicon to the silicide.

Thus, there remains a need in semiconductor device technology for inhibiting the outdiffusion of dopants from polycrystalline silicon into silicide conductive layers, and for blocking the diffusion of metal from silicide conductive layers to the gate oxide layers.

OBJECTS OF THE INVENTION

An object of the present invention is to provide for an improved semiconductor device.

Another object of the present invention is to provide for a method of reliably manufacturing a semiconductor device which utilizes a gate electrode that includes a refractory metal or metal silicide layer.

A further object of the present invention is to provide for a semiconductor device which includes a gate polysilicon that can be thinned to a thickness of less than 2000 A, and for the manufacturing of semiconductor device geometries of less than 0.5 um.

Still another object of the present invention is to provide a semiconductor device which inhibits the outdiffusion of dopants from polycrystalline silicon into silicide conductive layers.

Yet another object of the present invention is to provide a semiconductor device that prevents the atoms of a refractory metal or metal silicide from diffusing into the gate oxide film through a polysilicon layer during heat treatment in the manufacturing process so as to prevent deterioration of the gate oxide film.

SUMMARY OF THE INVENTION

Generally, the present invention relates to a semiconductor device which comprises a semiconductor substrate of a first conductivity type, a first conductive layer formed in the semiconductor substrate using a dopant, and being of a second conductivity type, a silicon-rich nitride film formed on the first conductive layer, and a second conductive layer formed on the silicon-rich nitride film. The silicon-rich nitride film inhibits outdiffusion of dopant from the first conductive layer into the second conductive layer, and blocks interdiffusion between the second conductive layer and the first conductive layer.

BRIEF DESCRIPTION OF THE DRAWINGS

These and other objects, features, aspects and advantages will be more readily apparent and better understood from the following detailed description of the invention, in which.

DETAILED DESCRIPTION OF THE PREFERRED EMBODIMENT

The present invention is described herein in the context of a dual work-function MOSFET merely as a specific example, and is not meant to limit applicability of the invention to such devices. Those skilled in the art will understood that the invention is broadly applicable to any semiconductor device in which it is necessary to inhibit the outdiffusion of dopants from a first conductive layer, such as a polycrystalline silicon layer, into a second conductive layer, such as a silicide conductive layer; and for blocking interdiffusion between the second conductive layer and the first conductive layer, which could cause defects in other layers, such as gate oxide layers.

Figure 1:
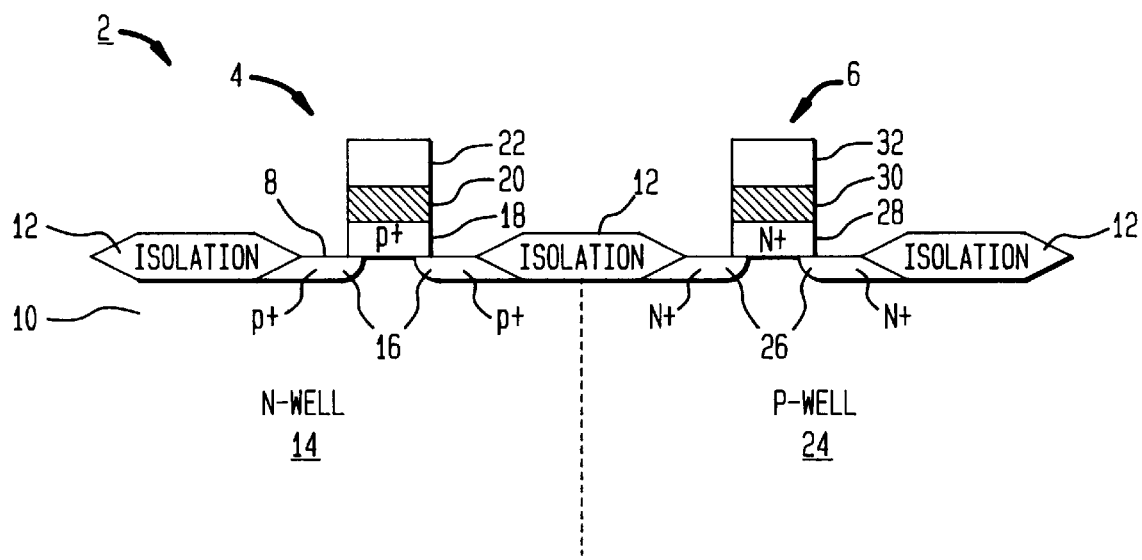
FIG. 1 shows a prior art dual-gate complementary-metal-oxide-semiconductor device with silicided gates.
Figure 2A:
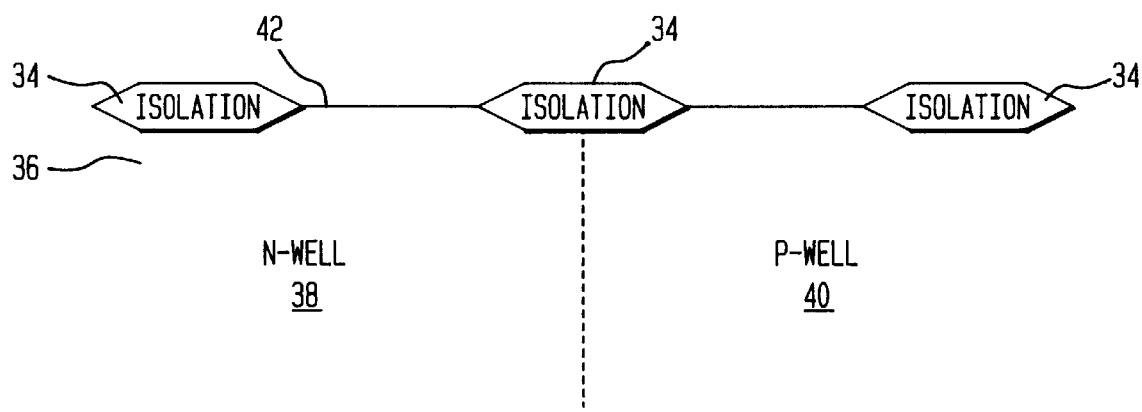
FIGS. 2A–E show process steps for fabricating a semiconductor device with a non-deposited barrier layer in accordance with the present invention.
Figure 2B:
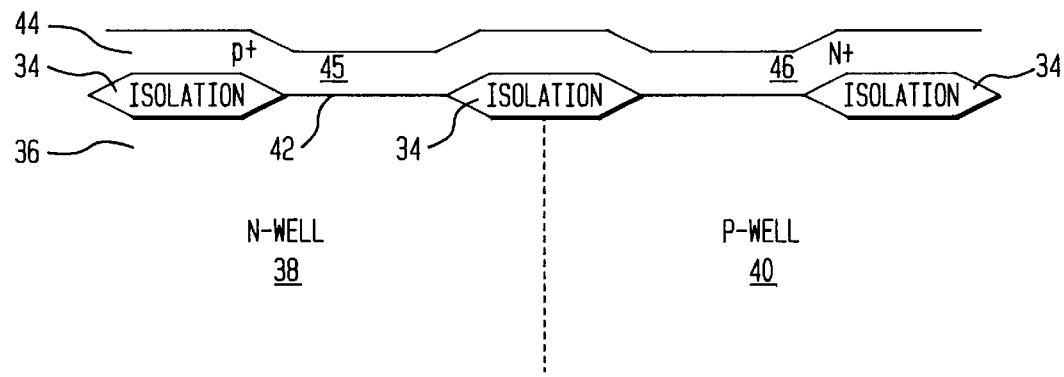

Referring to FIG. 2A, conventional techniques are used to form isolations 34 in substrate 36; conventional techniques of ion implantation are used to control threshold voltages; and conventional techniques of element separation are then used to form N-well 38 and P-well 40 regions in the substrate 36. A gate oxide film 42 is then grown on the substrate 36, typically to a thickness of approximately 80–100 Angstroms (A). Next, as shown in FIG. 2B, a polysilicon layer 44 is deposited over the isolations 34 and gate oxide film 42 to a thickness of approximately 1000–2000 A. The polysilicon layer 44 is masked with photoresist and selective implantation is conducted to selectively dope the polysilicon layer 44 in order to create a separate work-function device; the photoresist mask is then stripped subsequent to the selective implantation. As a specific example, arsenic or phosphorus is implanted into one region of the polysilicon layer 44 in order to create the N+ region 45, and boron is implanted into another region of the polysilicon layer 44 in order to create the P+ region 46. The implantations into the polysilicon layer 44 are conducted to concentrations which will stabilize the resulting work-function device.

Figure 2C:
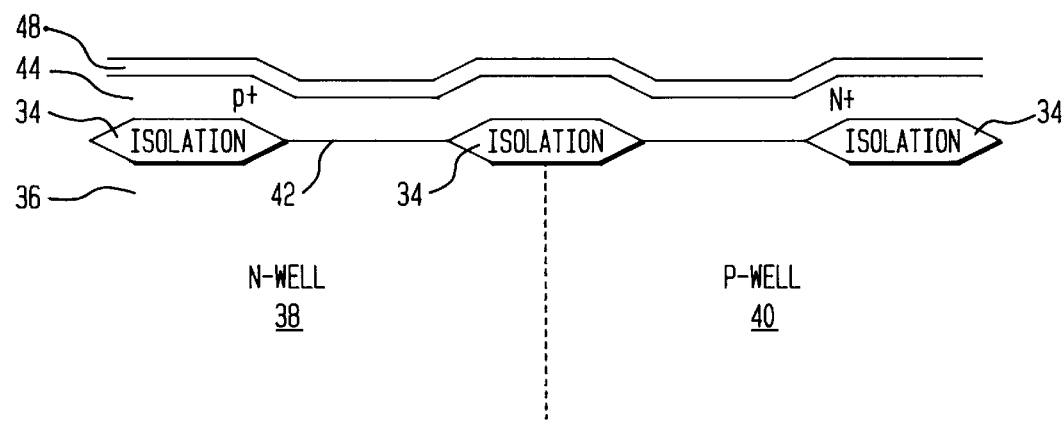

Subsequently, referring now to FIG. 2C, a silicon-rich nitride diffusion barrier film 48 is formed to a thickness of approximately 30–50 A on the surface of the doped polysilicon layer 44. The silicon-rich nitride diffusion barrier film 48 is formed without utilizing a deposition process. In a preferred embodiment, the silicon-rich nitride diffusion barrier film 48 is formed using a sputtering process. In this regard, since sputter preclean processes are implemented on standard metal sputter deposition tools for use in high volume manufacturing, such standard sputter deposition tools have the necessary characteristics for use in creating the silicon-rich nitride diffusion barrier film 48. As a specific example, although other tools commercially available from various other manufacturers can also be utilized to form the silicon-rich nitride diffusion barrier film 48, the commercially available model M2000, manufactured by the Varian Associates, located in Palo Alto, Calif., is a sputter deposition tool suitable for implementing in such a manner.

Such deposition tools create a high flux of low energy ions. The energy of the ions can be varied by varying the RF power and hence the bias on the wafer. In standard preclean processing using, for example, argon plasma, the argon ions have a low sticking coefficient and a relatively high sputter yield. In accordance with the present invention, a nitrogen plasma is used in lieu of the argon plasma. Nitrogen ions impinging on the polysilicon surface have a low sputter yield and an equilibrium is quickly reached between implanting the nitrogen and sputtering the surface material away. Such an equilibrium creates a nitridized layer, i.e., the silicon-rich nitride barrier film 48, having a thickness after equilibrium which is controlled solely by the ion energy. As such, control of thickness during formation of the silicon-rich nitride barrier film 48 is self-limiting, which is advantageous in terms of process control.

From a perspective of manufacturability, the conversion of a pre-clean tool from an argon plasma to a nitrogen plasma is straightforward. Nitrogen is provided through a calibrated mass flow controller in place of the argon. A nitrogen plasma can be ignited under the same conditions as the argon plasma. The resultant formation of a non-deposited 30–50 A silicon-rich nitride shows uniformities of 1% across 200 mm wafers. Similar to the optimization of uniform erosion with an argon plasma, it has been observed that proper conditions provide uniform nitridation with a nitrogen plasma.

Figure 2D:
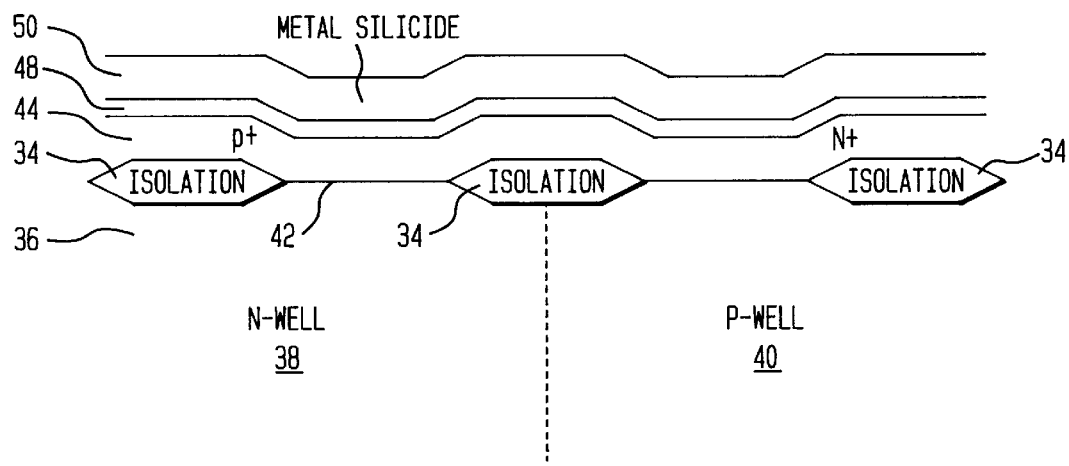

In accordance with the next step, referring now to FIG. 2D, a conductive layer 50, such as a metal silicide layer, is deposited on the silicon-rich nitride diffusion barrier film 48. The metal silicide layer 50 can be formed, for example, by sputtering from a silicide target, such as a titanium silicide layer, which is formed by sputtering to a thickness of approximately 2000 A or less. Note that a refractory metal layer comprising, for example, W, Ti, or Ta, can be formed in lieu of the metal silicide layer 50.

Advantageously, the silicon-rich nitride diffusion barrier film 48 inhibits outdiffusion of dopants from the polysilicon layer 44 into the metal silicide layer 50, and also blocks interdiffusion between the polysilicon layer 44 and the metal silicide layer 50, thus preventing metal diffusion from the metal silicide layer 50 to the gate oxide film 42. This prevents the prior art problems of resultant changes in the gate doping levels with the associated shift in the transistor threshold voltages and lower breakdown voltage of the gate oxide film 42. It should also be noted that this particular construction, i.e., using the barrier layer to separate the metal silicide layer and gate oxide film, is effective for extending the dual work-function polycide structure into submicron structures which have a polysilicon layer thickness on the order of approximately 1000–2000 A or less.

Figure 2E:
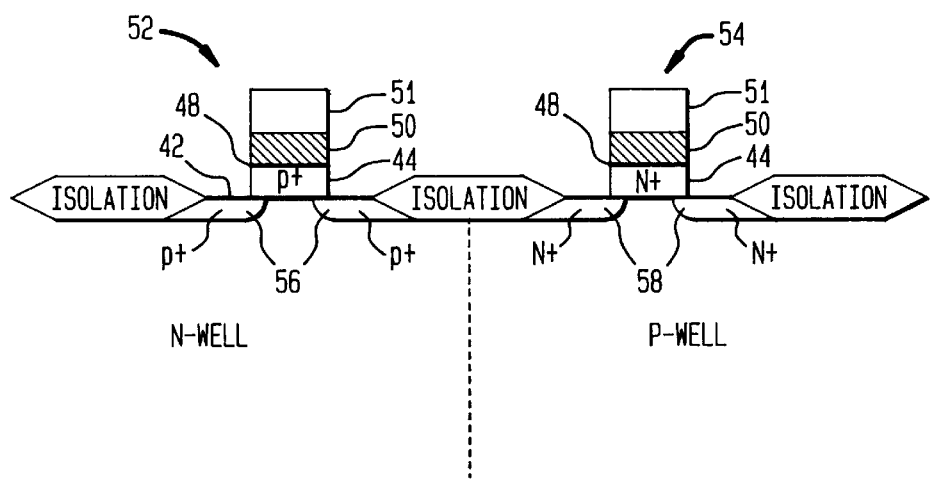

A dielectric or insulating layer is then applied on the metal silicide layer 50 and patterned using photoresist. With reference now to FIG. 2E, the insulating layer 51, metal silicide layer 50, silicon-rich nitride barrier film 48 and polysilicon layer 44 are then patterned by conventional techniques of anisotropic etching for forming gate electrode structures 52,54. Fabrication of the dual work-function MOSFET is completed by passivating the sidewalls of the gate electrode structures 52,54 with spacers for enabling implantation of P+ source/drain regions 56 and N+ source/drain regions 58, and for enabling heat treatment for driving in the necessary dopants.

Salicide/polycide gate electrodes allow for the reduction of polysilicon interconnect resistance for high performance CMOS processes. As transistors are scaled to below 0.5 micron geometries, polysilicon gate and interconnect resistances become a greater factor in device performance. At such geometries, a dual workfunction CMOS process must provide for the shunting of the two types of doped polysilicon by the metal silicide.

The scalability of the salicide/polycide gate electrode process, however, is limited by its stability to high temperature annealing. Such problems as dopant out-diffusion to the silicide and gate oxide integrity limit the gate structure unless a barrier layer is present between the metal silicide and polysilicon during annealing.

Lowering the sheet resistance of the gate conductor enables the speed of submicron CMOS devices. However, the vertical continuity (contact resistance to the gate oxide) can limit the circuit speed for salicide and polycide gate electrodes if there is a parasitic series capacitance. This is caused by a discontinuity in the electrode. A capacitance is introduced between the metal overlayer and the polysilicon if an insulating material is formed in the barrier layer. However, for polycide gate electrodes fabricated with the 30 A nitrogen-rich barrier layer, the average gate delay of ring oscillators showed no evidence of a parasitic series capacitance.

Figure 3:
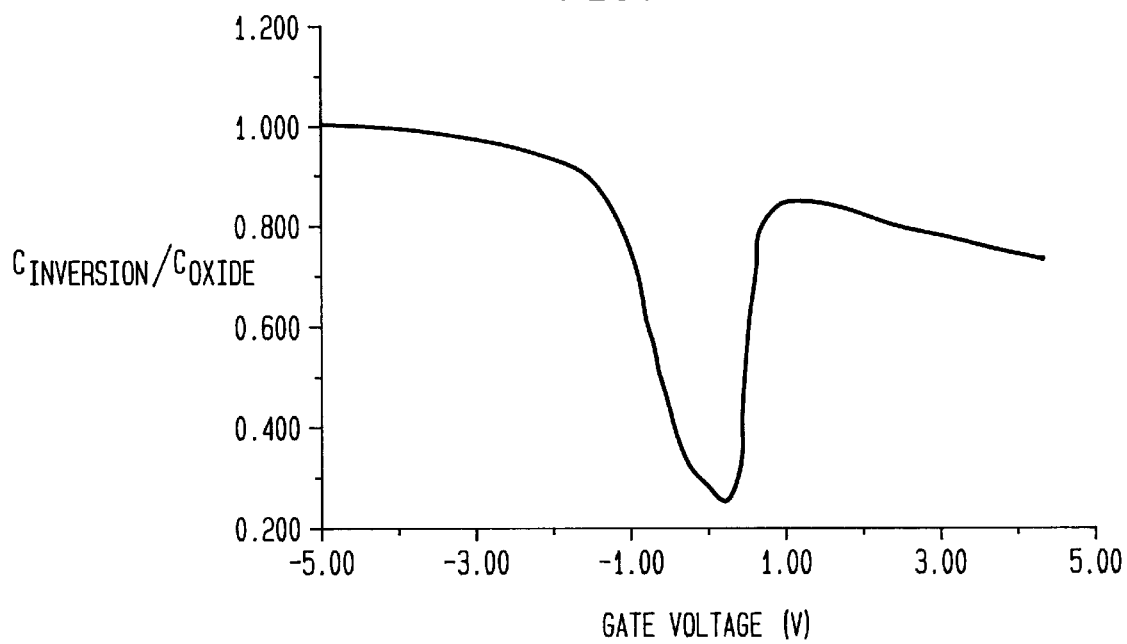
FIG. 3 shows a plot of $C_{inversion}/C_{oxide}$ versus gate voltage for a TiSi$_2$N+ polysilicon capacitor structure.

Referring now to FIG. 3, for gate conductor structures without a diffusion barrier, an inversion capacitance dependence on gate bias is observed in the plot of $C_{inversion}/C_{oxide}$ ($C_{inversion}$ being normalized with $C_{oxide}$, which is the calculated capacitance of the oxide in the structure) versus gate voltage. This anomalous characteristic for a $TiSi_2$/N+ polysilicon capacitor structure which was investigated with both quasi-static and high frequency C-V. The ratio of $C_{inversion}/C_{oxide}$ is 0.79 at a gate bias of 3.0V. Such "gate depletion" effects are shown to be linked to dopant outdiffusion.

Figure 4:
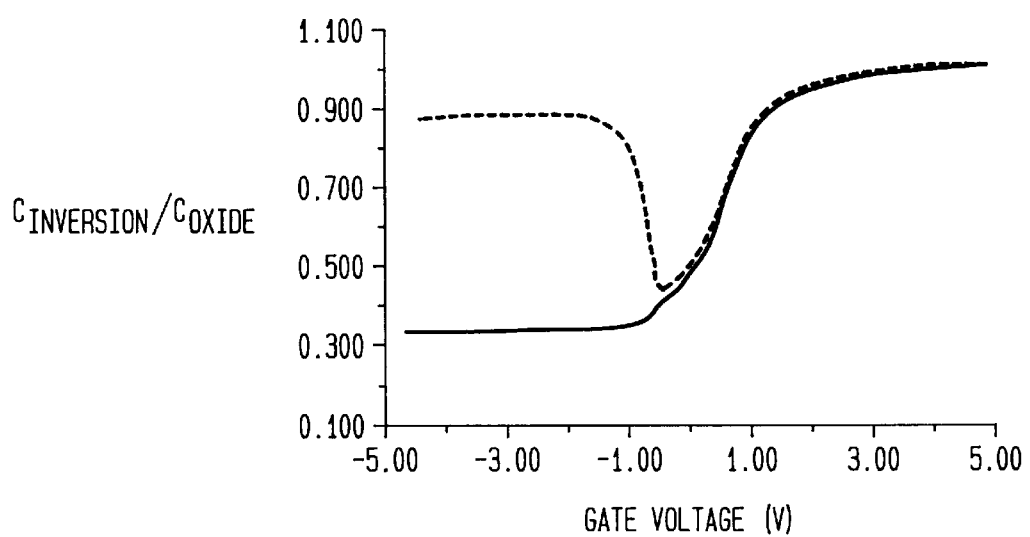
FIG. 4 shows a plot of $C_{inversion}/C_{oxide}$ versus gate voltage for a TiSi$_2$/P+ polysilicon capacitor structure.

FIG. 4 shows the high frequency C-V curves ($C_{inversion}/C_{oxide}$ versus gate voltage) of $TiSi_2$/P+ polysilicon capacitors on gate oxide. The C-V curve for capacitors annealed through high temperature rapid thermal annealing is shown. The measured inversion capacitance is smaller than the theoretical value at threshold voltage and $C_{inversion}$ decreases with gate bias. Secondary Ion Mass Spectrometry analysis demonstrated that the dopant species distribution in the polysilicon is not uniform for high temperature anneals and that the dopants outdiffuse into the $TiSi_2$, causing the polysilicon to lose its degenerate concentration.

Figure 5:
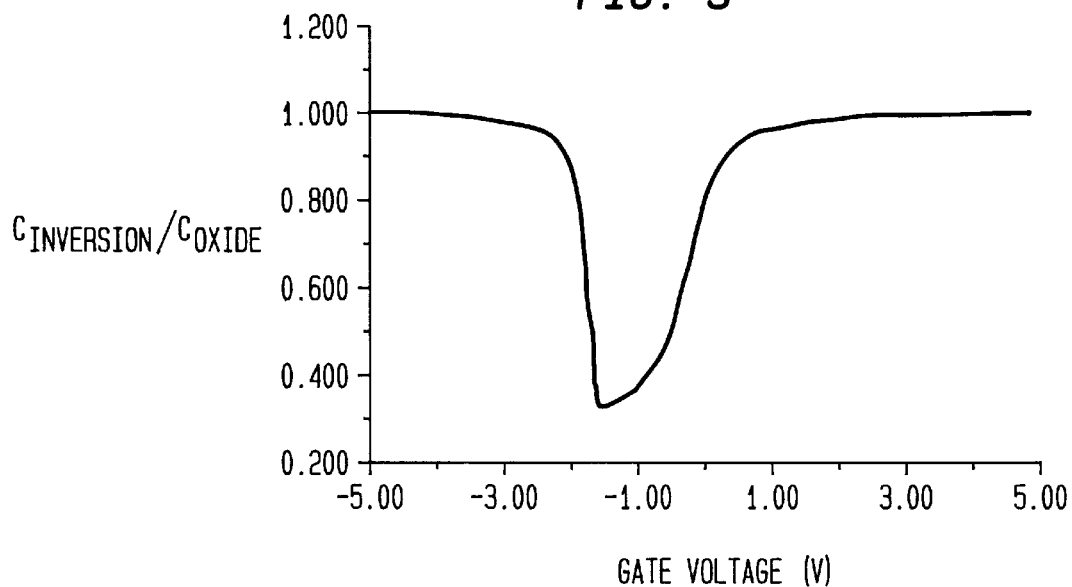
FIG. 5 shows a plot of $C_{inversion}/C_{oxide}$ versus gate voltage for a TiSi$_2$/P+ polysilicon capacitor structure with a barrier layer in accordance with the present invention.
Figure 6:
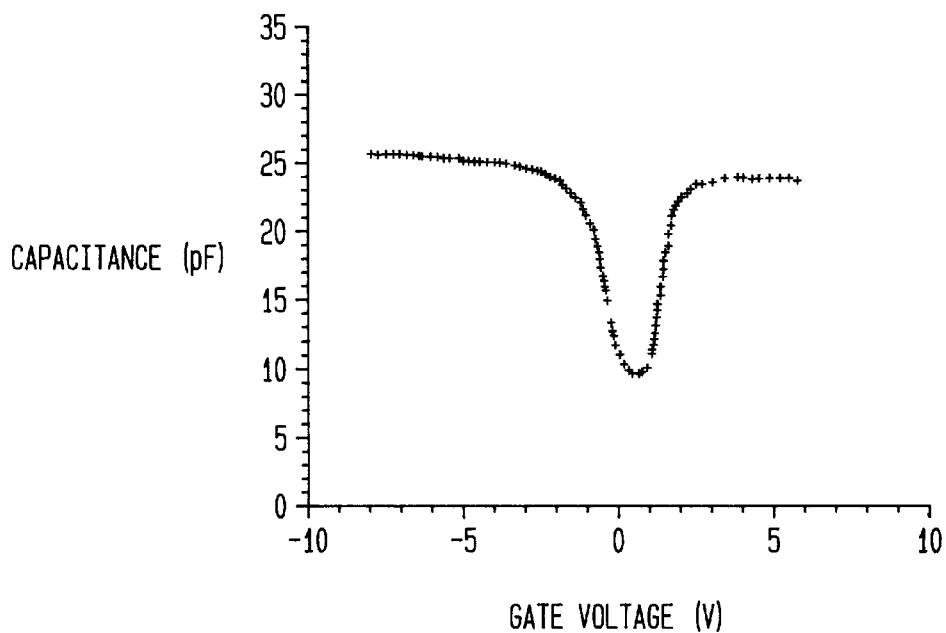
FIG. 6 shows a plot of capacitance versus gate voltage for a TiSi$_2$/N+ polysilicon capacitor structure with a barrier layer in accordance with the present invention.

FIGS. 5 and 6 show the beneficial effect of the thin nitride barrier layer in minimizing gate depletion effect between $TiSi_2$ and doped polysilicon conductor layers. In FIG. 5, the gate depletion effect for a $TiSi_2$/nitride/P+ polysilicon structure is greatly suppressed with a $C_{inversion}/C_{oxide}$ ratio of 0.95. FIG. 6 shows a similar effect for the $TiSi_2$/nitride/N+ polysilicon structure (note that the capacitance of the structure is not normalized with $C_{oxide}$ in this plot). The presence of the nitride diffusion barrier serves to restrict the outdiffusion of dopants such that the $C_{inverion}/C_{oxide}$ ratio of 0.90.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A method of fabricating a semiconductor device, comprising the steps of:
   (a) providing a semiconductor substrate of a first conductivity type;
   (b) growing a first insulation film on said semiconductor substrate;
   (c) depositing a first conductive layer including silicon on said first insulation film, said first conductive layer being of a second conductivity type;
   (d) forming a silicon-rich nitride film from said first conductive layer on a surface thereof by causing nitrogen ions to impinge on the surface, a thickness of said silicon-rich nitride film being determined by the energy of the nitrogen ions;
   (e) forming a second conductive layer on said silicon-rich nitride film;
   (f) forming a second insulating layer on said second conductive layer;
   (g) patterning said second insulating layer, said second conductive layer, said silicon-rich nitride film and said first conductive layer so as to form a gate electrode structure; and
   (h) implanting impurities to form a source region and a drain region in said semiconductor substrate, said source region and said drain region being of the second conductivity type.

2. A method according to claim 1, wherein said step (d) of forming a silicon-rich nitride film comprises a self-limiting process.

3. A method according to claim 2, wherein said self-limiting process comprises implanting the nitrogen ions in said first conductive layer.

4. A method according to claim 3, wherein said self-limiting process forms said silicon-rich nitride film with the thickness of said film being determined solely by the energy of the nitrogen ions.

5. A method according to claim 1, wherein said step (d) of forming a silicon-rich nitride film comprises sputtering.

* * * * *